United States Patent
Kim et al.

(10) Patent No.: US 11,835,818 B2
(45) Date of Patent: Dec. 5, 2023

(54) DISPLAY APPARATUS AND LIGHT SOURCE APPARATUS THEREOF

(71) Applicant: SAMSUNG ELECTRONICS CO., LTD., Suwon-si (KR)

(72) Inventors: Sungyeol Kim, Suwon-si (KR); Chunsoon Park, Suwon-si (KR); Kyehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/962,234

(22) Filed: Oct. 7, 2022

(65) Prior Publication Data

US 2023/0194924 A1 Jun. 22, 2023

Related U.S. Application Data

(63) Continuation of application No. PCT/KR2022/013338, filed on Sep. 6, 2022.

(30) Foreign Application Priority Data

Dec. 22, 2021 (KR) .......................... 10-2021-0185177

(51) Int. Cl.
*G02F 1/00* (2006.01)
*G02F 1/13357* (2006.01)

(52) U.S. Cl.
CPC .. *G02F 1/133605* (2013.01); *G02F 1/133603* (2013.01)

(58) Field of Classification Search
None
See application file for complete search history.

(56) References Cited

U.S. PATENT DOCUMENTS

| 9,971,197 B2 | 5/2018 | Song et al. |
| 10,553,763 B2 | 2/2020 | Yamada et al. |
| 2006/0083027 A1* | 4/2006 | Lin ................... G02F 1/133615 362/23.15 |

(Continued)

FOREIGN PATENT DOCUMENTS

| JP | 2013-143219 A | 7/2013 |
| JP | 2017-157278 A | 9/2017 |

(Continued)

OTHER PUBLICATIONS

International Search Report (PCT/ISA/210) issued from the International Searching Authority dated Jan. 10, 2023 to International Application No. PCT/KR2022/013338.

(Continued)

*Primary Examiner* — Gerald J Sufleta, II
(74) *Attorney, Agent, or Firm* — Sughrue Mion, PLLC

(57) ABSTRACT

Disclosed herein is a display apparatus and a light source apparatus thereof. The light source apparatus includes a reflective sheet in which a through hole is formed, a light source disposed in the through hole and including a light emitting diode, and a substrate to which the light emitting diode is attached and including a protection layer disposed on one side facing the reflective sheet. The protection layer includes a first protection layer disposed adjacent to the light emitting diode, and a second protection layer having a lower reflectance than the first protection layer.

15 Claims, 10 Drawing Sheets

(56) References Cited

U.S. PATENT DOCUMENTS

2011/0044027 A1* 2/2011 Chen ................. G02F 1/133605
                                                    257/E33.044
2011/0096265 A1 4/2011 Murakoshi et al.
2015/0219966 A1* 8/2015 Song ....................... F21V 5/046
                                                    362/97.3

FOREIGN PATENT DOCUMENTS

KR  10-2015-0077153 A  7/2015
KR     10-2203950 B1   1/2021

OTHER PUBLICATIONS

Written Opinion (PCT/ISA/237) issued from the International Searching Authority dated Jan. 10, 2023 to International Application No. PCT/KR2022/013338.

* cited by examiner

DISPLAY APPARATUS AND LIGHT SOURCE APPARATUS THEREOF

CROSS-REFERENCE TO RELATED APPLICATION(S)

This application is a continuation application, under 35 U.S.C. § 111(a), of international application No. PCT/KR2022/013338, filed on Sep. 6, 2022, which claims priority to Korean Patent Application No. 10-2021-0185177, filed on Dec. 22, 2021, in the Korean Intellectual Property Office, the disclosure of which is incorporated by reference herein in its entirety

BACKGROUND

1. Field

The disclosure relates to a display apparatus and a light source apparatus thereof, and more particularly, to a display apparatus including an improved optical structure and a light source apparatus thereof.

2. Description of Related Art

Generally, a display apparatus is a kind of an output apparatus that converts obtained or stored electrical information into visual information and displays the visual information to a user, and the display apparatus is used in various fields, such as home or workplace.

The display apparatus includes a monitor apparatus connected to a personal computer or a server computer, a portable computer device, a navigation terminal device, a general television apparatus, an Internet Protocol television (IPTV), a portable terminal device, such as a smart phone, a tablet PC, a personal digital assistant (PDA) or a cellular phone, various display apparatuses used to reproduce images, such as advertisements or movies in an industrial field, or various kinds of audio/video systems.

The display apparatus includes a light source module, which converts electrical information into visual information, and the light source module includes a plurality of light sources configured to independently emit light.

Each of the plurality of light sources includes a light emitting diode (LED) or an organic light emitting diode (OLED). For example, the LED or the OLED may be mounted on a circuit board or a substrate.

SUMMARY

Therefore, it is an aspect of the disclosure to provide a display apparatus capable of improving a light efficiency while maintain a luminance uniformity, and a light source apparatus thereof.

Additional aspects of the disclosure will be set forth in part in the description which follows and, in part, will be obvious from the description, or may be learned by practice of the disclosure.

According to an aspect of the disclosure, there is provided a light source apparatus including: a reflective sheet having a through hole; a light source provided in the through hole and including a light emitting diode; and a substrate to which the light emitting diode is attached and including a protection layer provided on a first side of the substrate facing the reflective sheet, wherein the protection layer includes: a first protection layer provided adjacent to the light emitting diode; and a second protection layer having a lower reflectance than the first protection layer.

The light source apparatus may further include: a first region adjacent to the light emitting diode; a second region in which the reflective sheet is provided; and a third region between the first region and the second region, wherein a first reflectance of the first region, a second reflectance of the second region, and a third reflectance of the third region satisfy the following relationship: third reflectance<first reflectance<second reflectance.

The light source may include an optical dome provided to cover the light emitting diode and provided to be spaced apart from the reflective sheet.

A size of the first protection layer may correspond to a size of the optical dome.

A size of the first protection layer may be greater than a size of the optical dome.

A size of the first protection layer may be less than a size of the optical dome.

The first protection layer may have a lower reflectance than the reflective sheet.

The light source may include a reflective layer provided in front of the light emitting diode, the reflective layer including a multilayer reflective structure.

The substrate may include: an insulation layer; a conduction layer provided between the insulation layer and the protection layer; and a power supply line and a power supply pad provided on the conduction layer to supply power to the light emitting diode.

The protection layer may include a window configured to allow the power supply pad to be electrically connected to the light emitting diode.

According to another aspect of the disclosure, there is provided a display apparatus including: a body; and a light source apparatus provided in the body, wherein the light source apparatus includes: a reflective sheet having a through hole; a light source provided in the through hole and including a light emitting diode; and a substrate provided to support the light source, wherein a first reflectance of a first region adjacent to the light emitting diode, a second reflectance of a second region, in which the reflective sheet is provided, and a third reflectance of a third region between the first region and the second region satisfy the following relationship: third reflectance<first reflectance<second reflectance.

The light source may include an optical dome configured to cover the light emitting diode and provided to be spaced apart from the reflective sheet.

A size of the first region may correspond to a size of the optical dome.

A size of the first region may be greater than a size of the optical dome.

A size of the first region may be less than a size of the optical dome.

According to another aspect of the disclosure, there is provided a light source apparatus including: a substrate; a reflective sheet provided on the substrate and having a plurality of through holes; a plurality of light emitting diode provided on substrate, wherein each of the plurality of light emitting diode is provided in a respective one of the through holes of the reflective sheet, wherein a first reflectance of a first region adjacent to the light emitting diode is less than a second reflectance of a second region in which the reflective sheet is provided, and wherein a third reflectance of a third region between the first region and the second region is less than the first reflectance.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
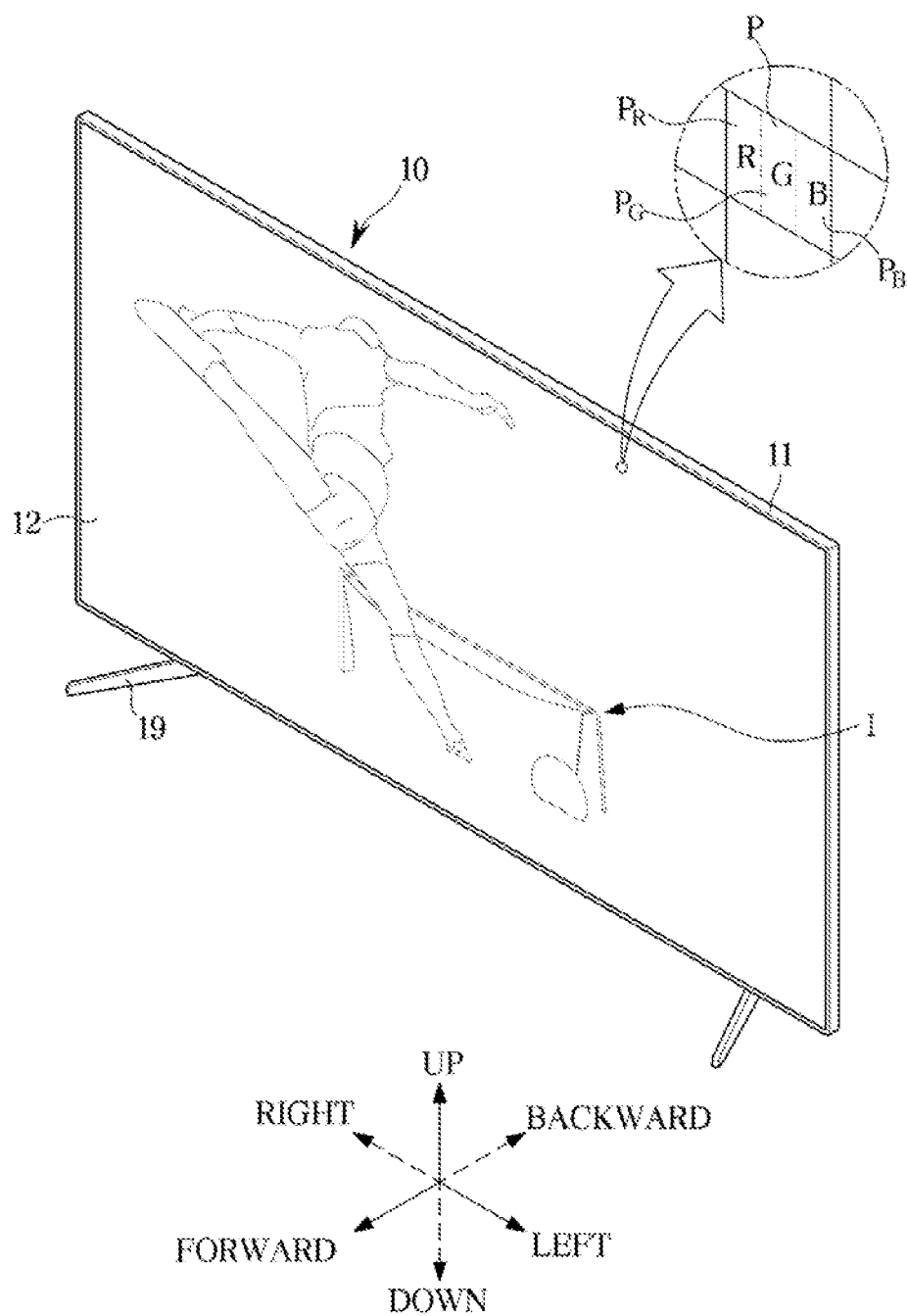
FIG. 1 is a view of an appearance of a display apparatus according to an example embodiment of the disclosure.

In the following description, like reference numerals refer to like elements throughout the specification. Well-known functions or constructions are not described in detail since they would obscure the one or more exemplar embodiments with unnecessary detail. Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

It will be understood that, although the terms first, second, third, etc., may be used herein to describe various elements, but is should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step. The each step may be implemented in the order different from the illustrated order unless the context clearly indicates otherwise.

Hereinafter exemplary embodiments of the disclosure will be described in detail with reference to the accompanying drawings.

FIG. 1 is a view illustrating an appearance of a display apparatus according to an example embodiment of the disclosure.

A display apparatus 10 is a device that processes an image signal received from the outside and visually displays the processed image. Hereinafter a case in which the display apparatus 10 is a television is exemplified, but the disclosure is not limited thereto. For example, the display apparatus 10 may be implemented in various forms, such as a monitor, a portable multimedia device, and a portable communication device, and the display apparatus 10 is not limited in its shape as long as it is visually displaying an image.

The display apparatus 10 may be a large format display (LFD) installed outdoors, such as a roof of a building or a bus stop. However, the disclosure is not limited to the outside of a building, and as such, according to other example embodiment, the display apparatus 10 according to another example embodiment may be installed in a place the display apparatus is accessed by a large number of people, even indoors, such as subway stations, shopping malls, movie theaters, companies, and stores.

The display apparatus 10 may receive content data including video data and audio data from various content sources and output video and audio corresponding to the video data and the audio data. For example, the display apparatus 10 may receive content data through a broadcast reception antenna or cable, receive content data from a content playback device, or receive content data from a content providing server of a content provider.

As illustrated in FIG. 1, the display apparatus 10 includes a body 11, a screen 12 provided to display an image I, and a supporter 19 provided below the body 11 to support the body 11.

The body 11 may form an appearance of the display apparatus 10, and the body 11 may include a component configured to allow the display apparatus 10 to display the image I and to perform various functions. Although the body 11 shown in FIG. 1 is in the form of a flat plate, the shape of the body 11 is not limited thereto. For example, the body 11 may have a curved plate shape.

The screen 12 may be formed on a front surface of the body 11, and display the image I. For example, the screen 12 may display a still image or a moving image. Further, the screen 12 may display a two-dimensional plane image or a three-dimensional image using binocular parallax of the user.

A plurality of pixels P may be formed on the screen 12 and the image I displayed on the screen 12 may be formed by a combination of the lights emitted from the plurality of pixels P. For example, the image I may be formed on the screen 12 by combining light emitted from the plurality of pixels P as a mosaic.

Each of the plurality of pixels P may emit different brightness and different color of light. In order to emit different brightness of light, each of the plurality of pixels P may include a self-luminous panel configured to directly emit light or a non-self-luminous panel configured to transmit or block light emitted by a light source apparatus. For example, the self-luminous panel may be a light emitting diode panel and the non-self-luminous panel may be a liquid crystal panel.

In order to emit light in the various colors, the plurality of pixels P may include sub-pixels $P_R$, $P_G$, and $P_B$, respectively.

The sub-pixels $P_R$, $P_G$, and $P_B$ may include a red sub pixel $P_R$ emitting red light, a green sub pixel $P_G$ emitting green light, and a blue sub pixel $P_B$ emitting blue light. For example, the red light may represent a light beam having a wavelength of approximately 620 nm (nanometers, one billionth of a meter) to 750 nm, the green light may represent a light beam having a wavelength of approximately 495 nm to 570 nm, and the blue light may represent a light beam having a wavelength of approximately 450 nm to 495 nm.

By combining the red light of the red sub pixel $P_R$, the green light of the green sub pixel $P_G$ and the blue light of the blue sub pixel $P_B$, each of the plurality of pixels P may emit different brightness and different color of light.

Figure 2:
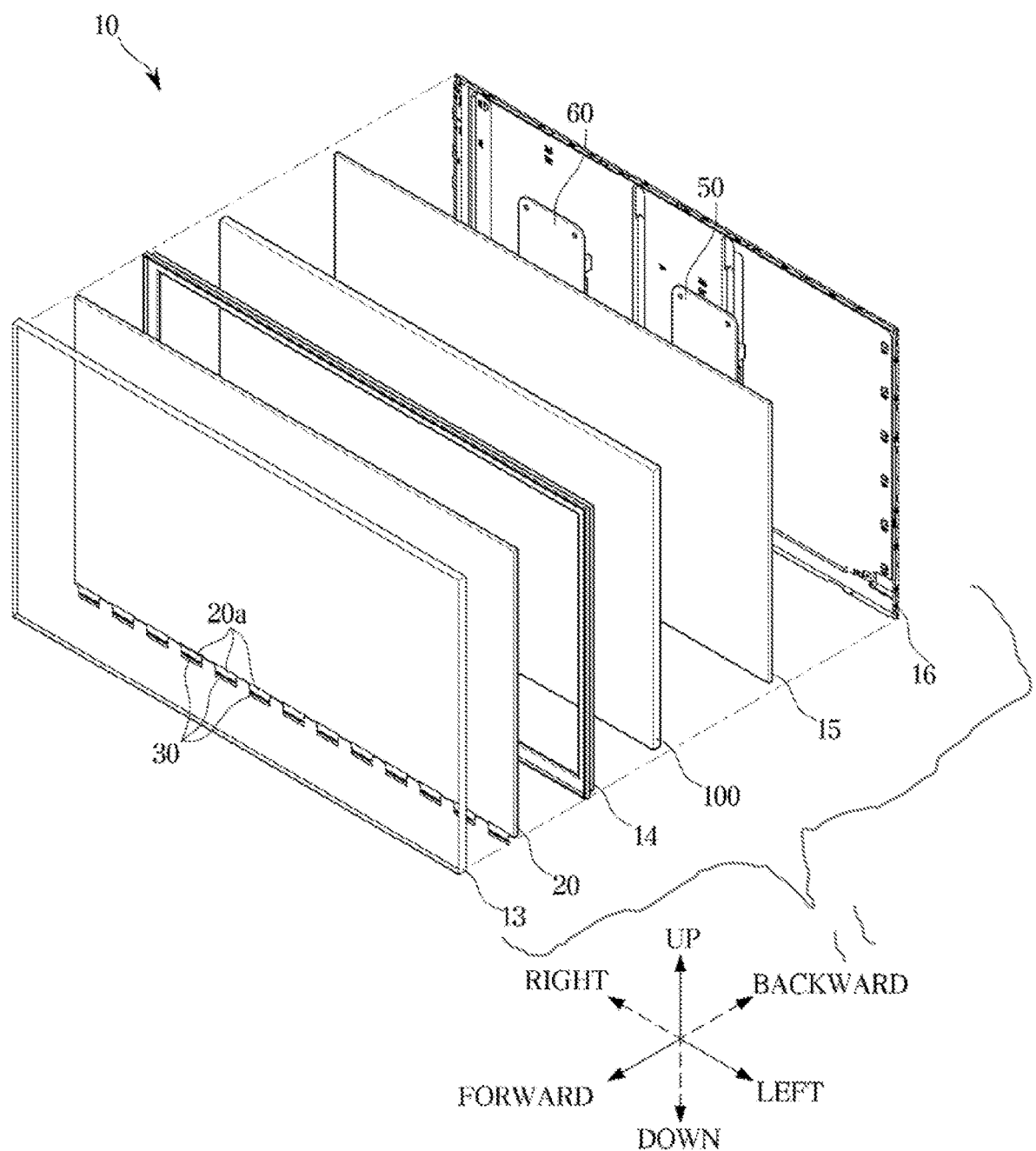
FIG. 2 is an exploded view of the display apparatus shown in FIG. 1.

FIG. 2 is an exploded view of the display apparatus shown in FIG. 1.

As shown in FIG. 2, various components configured to generate the image I on the screen S may be provided inside the body 11 according to an example embodiment.

For example, the body 11 includes a light source apparatus 100 that is a surface light source, a liquid crystal panel 20 configured to block or transmit light emitted from the light source apparatus 100, a control assembly 50 configured to control an operation of the light source apparatus 100 and the liquid crystal panel 20, and a power assembly 60 configured to supply power to the light source apparatus 100 and the liquid crystal panel 20. Further, the body 11 includes a bezel 13, a frame middle mold 14, a bottom chassis 15 and a rear cover 16 which are provided to support and fix the liquid crystal panel 20, the light source apparatus 100, the control assembly 50 and the power assembly 60.

According to an example embodiment, the display apparatus may include to a cable 20a configured to transmit image data to the liquid crystal panel 20, and a display driver integrated circuit (DDI) (hereinafter referred to as 'driver IC') 30 configured to process digital image data and output an analog image signal are provided at one side of the liquid crystal panel 20.

The cable 20a may electrically connect the control assembly 50/the power assembly 60 to the driver IC 30, and may also electrically connect the driver IC 30 to the liquid crystal panel 20. The cable 20a may include a flexible flat cable or a film cable that is bendable.

The driver IC 30 may receive image data and power from the control assembly 50/the power assembly 60 through the cable 20a. The driver IC 30 may transmit the image data and driving current to the liquid crystal panel 20 through the cable 20a.

In addition, the cable 20a and the driver IC 30 may be integrally implemented as a film cable, a chip on film (COF), or a tape carrier package (TCP). In other words, the driver IC 30 may be arranged on the cable 20b. However, the disclosure is not limited thereto, and the driver IC 30 may be arranged on the liquid crystal panel 20.

The control assembly 50 may include a control circuit configured to control an operation of the liquid crystal panel 20 and the light source apparatus 100. The control circuit may process image data received from an external content source, transmit the image data to the liquid crystal panel 20, and transmit dimming data to the light source apparatus 100.

The power assembly 60 may supply power to the liquid crystal panel 20 and the light source apparatus 100 to allow the light source apparatus 100 to output surface light and to allow the liquid crystal panel 20 to block or transmit the light of the light source apparatus 100.

The control assembly 50 and the power assembly 60 may be implemented as a printed circuit board and various circuits mounted on the printed circuit board. For example, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

The light source apparatus 100 may include a point light source configured to emit monochromatic light or white light. The light source apparatus 100 may refract, reflect, and scatter light in order to convert light, which is emitted from the point light source, into uniform surface light. For example, the light source apparatus 100 may include a plurality of light sources configured to emit monochromatic light or white light, a diffuser plate configured to diffuse light incident from the plurality of light sources, a reflective sheet configured to reflect light emitted from the plurality of light sources and a rear surface of the diffuser plate, and an optical sheet configured to refract and scatter light emitted from a front surface of the diffuser plate.

As mentioned above, the light source apparatus 100 may refract, reflect, and scatter light emitted from the light source, thereby emitting uniform surface light toward the front.

A configuration of the light source apparatus 100 will be described in more detail below.

Figure 3:
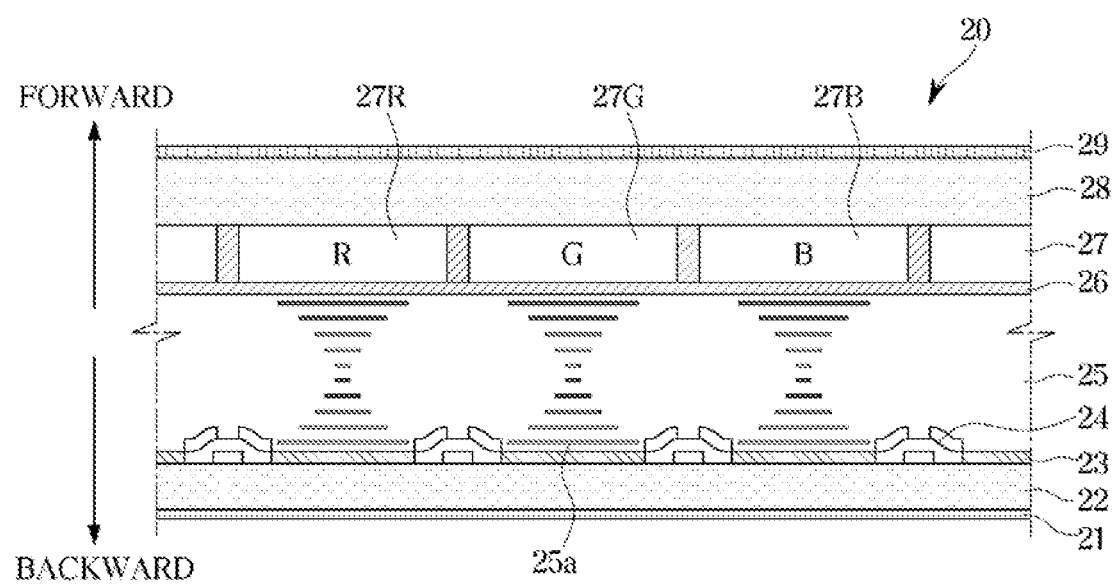
FIG. 3 is a side sectional view of a liquid crystal panel of the display apparatus shown in FIG. 2.

FIG. 3 is a side sectional view of a liquid crystal panel of the display apparatus shown in FIG. 2 according to an example embodiment.

The liquid crystal panel 20 is provided in front of the light source apparatus 100 and blocks or transmits light emitted from the light source apparatus 100 to form the image I.

A front surface of the liquid crystal panel 20 may form the screen 12 of the display apparatus 10 described above, and the liquid crystal panel 20 may form the plurality of pixels P. In the liquid crystal panel 20, the plurality of pixels P may independently block or transmit light from the light source apparatus 100, and the light transmitted through the plurality of pixels P may form the image I displayed on the screen 12.

For example, as shown in FIG. 3, the liquid crystal panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 are provided on the outside of the first and second transparent substrates 22 and 28.

Each of the first polarizing film 21 and the second polarizing film 29 may transmit a specific light beam and block other light beams. For example, the first polarizing film 21 transmits a light beam having a magnetic field vibrating in a first direction and blocks other light beams. In addition, the second polarizing film 29 transmits a light beam having a magnetic field vibrating in a second direction and blocks other light beams. In this case, the first direction and the second direction may be perpendicular to each other.

Accordingly, a polarization direction of the light transmitted through the first polarizing film 21 and a vibration direction of the light transmitted through the second polarizing film 29 are perpendicular to each other. As a result, in general, light may not pass through the first polarizing film 21 and the second polarizing film 29 at the same time.

The color filter 27 may be provided inside the second transparent substrate 28.

The color filter 27 may include a red filter 27R transmitting red light, a green filter 27G transmitting green light, and a blue filter 27G transmitting blue light. The red filter 27R, the green filter 27G, and the blue filter 27B may be provided parallel to each other. A region, in which the color filter 27 is formed, corresponds to the pixel P described above. A region, in which the red filter 27R is formed, corresponds to the red sub-pixel $P_R$, a region, in which the green filter 27G is formed, corresponds to the green sub-pixel $P_G$, and a region, in which the blue filter 27B is formed, corresponds to the blue sub-pixel $P_B$.

The pixel electrode 23 may be provided inside the first transparent substrate 22, and the common electrode 26 may be provided inside the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules 25a forming the liquid crystal layer 25 to be described below.

The pixel electrode 23 and the common electrode 26 may be formed of a transparent material, and may transmit light incident from the outside. For example, the pixel electrode 23 and the common electrode 26 may include indium tin oxide (ITO), indium zinc oxide (IZO), silver nanowire (Ag nano wire), carbon nanotube (CNT), graphene, or poly (3,4-ethylenedioxythiophene) (PEDOT).

The thin film transistor (TFT) 24 is provided inside the second transparent substrate 22.

The TFT 24 may transmit or block a current flowing through the pixel electrode 23. For example, an electric field may be formed or removed between the pixel electrode 23 and the common electrode 26 in response to turning on (closing) or turning off (opening) the TFT 24.

The TFT 24 may be formed of poly-silicon, and may be formed by semiconductor processes, such as lithography, deposition, and ion implantation.

The liquid crystal layer 25 is formed between the pixel electrode 23 and the common electrode 26, and the liquid crystal layer 25 is filled with the liquid crystal molecules 25a.

Liquid crystals represent an intermediate state between a solid (crystal) and a liquid. Most of the liquid crystal materials are organic compounds, and the molecular shape is in the shape of an elongated rod, and the orientation of molecules is in an irregular state in one direction, but in a regular state in other directions. As a result, the liquid crystal has both the fluidity of the liquid and the optical anisotropy of the crystal (solid).

In addition, liquid crystals also exhibit optical properties according to changes in an electric field. For example, in the liquid crystal, the orientation of molecules forming the liquid crystal may change according to a change in an electric field. In response to an electric field being generated in the liquid crystal layer 25, the liquid crystal molecules 25a of the liquid crystal layer 25 may be provided along the direction of the electric field. In response to the electric field not being generated in the liquid crystal layer 25, the liquid crystal molecules 25a may be provided irregularly or provided along an alignment layer. As a result, the optical properties of the liquid crystal layer 25 may vary depending on the presence or absence of the electric field passing through the liquid crystal layer 25.

Hereinafter the light source apparatus 100 will be described.

Figure 4:
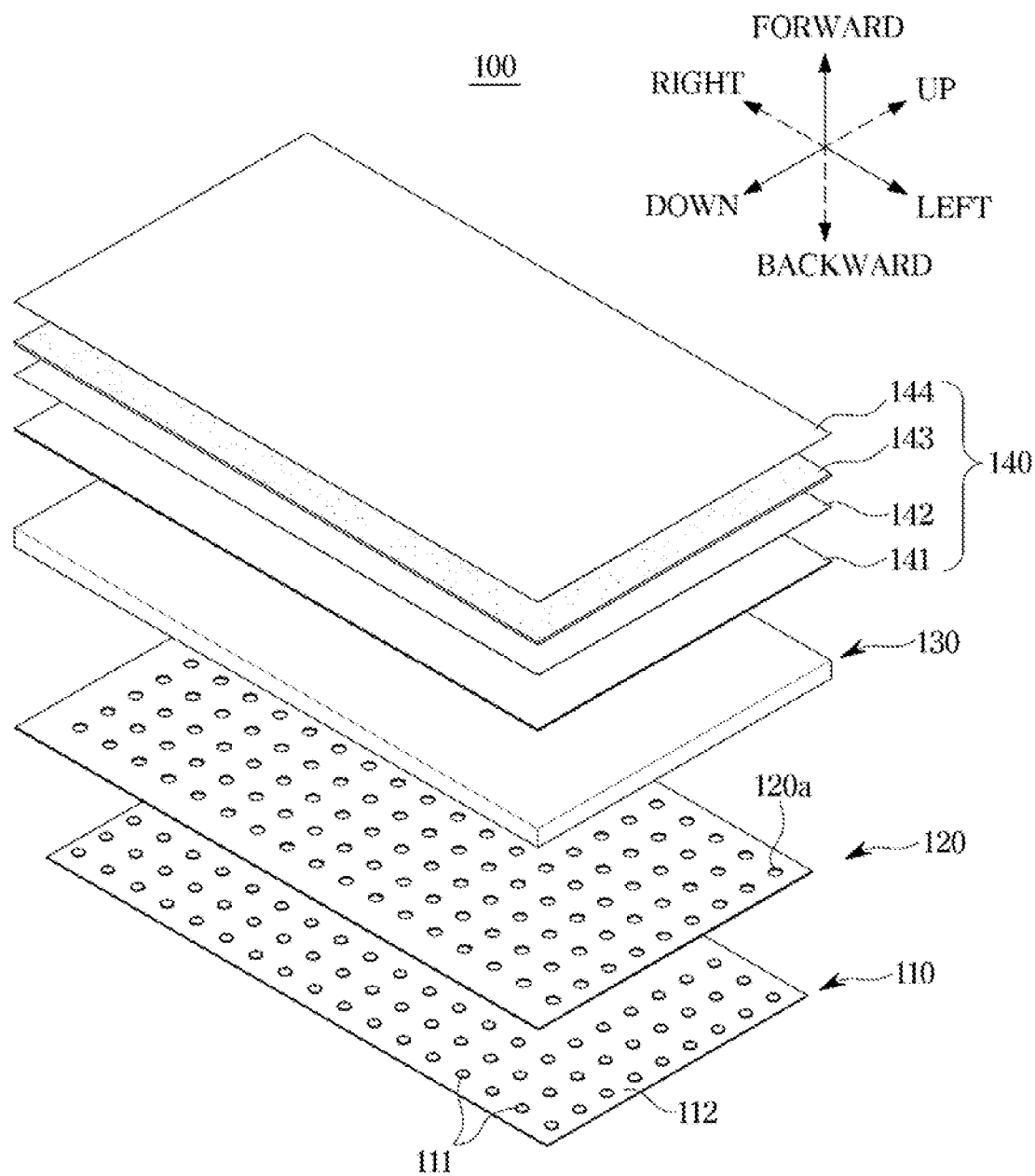
FIG. 4 is an exploded view of a light source apparatus shown in FIG. 2.
Figure 5:
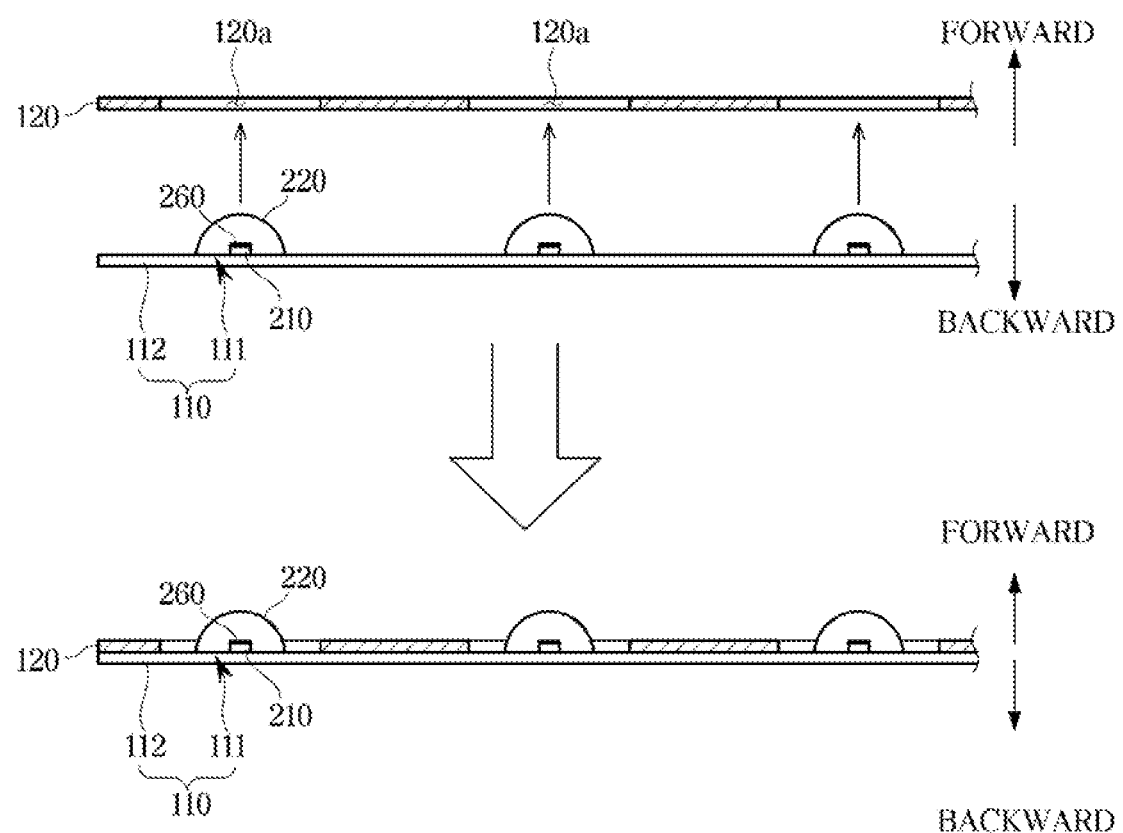
FIG. 5 is a view illustrating coupling between a light source module included in the light source apparatus, and a reflective sheet shown in FIG. 4 according to an example embodiment.

FIG. 4 is an exploded view of a light source apparatus shown in FIG. 2. FIG. 5 is a view illustrating coupling between a light source module included in the light source apparatus, and a reflective sheet shown in FIG. 4.

The light source apparatus 100 includes a light source module 110 configured to generate light, a reflective sheet 120 configured to reflect light, a diffuser plate 130 configured to uniformly diffuse light, and an optical sheet 140 configured to improve a luminance of light that is emitted.

The light source module 110 may include a plurality of light sources 111 configured to emit light, and a substrate 112 provided to support/fix the plurality of light sources 111.

The plurality of light sources 111 may be provided in a predetermined pattern to allow light to be emitted with uniform luminance. The plurality of light sources 111 may be provided in such a way that a distance between one light source and light sources adjacent thereto is the same.

For example, as shown in FIG. 4, the plurality of light sources 111 may be provided in rows and columns. Accordingly, the plurality of light sources may be provided such that an approximately square is formed by four adjacent light sources. In addition, any one light source may be provided adjacent to four light sources, and a distance between one light source and four adjacent light sources may be approximately the same.

Alternatively, the plurality of light sources may be provided in a plurality of rows, and a light source belonging to each row may be provided at the center of two light sources belonging to an adjacent row. Accordingly, the plurality of light sources may be provided such that an approximately equilateral triangle is formed by three adjacent light sources. In this case, one light source may be provided adjacent to six light sources, and a distance between one light source and six adjacent light sources may be approximately the same.

However, the pattern in which the plurality of light sources 111 is provided is not limited to the pattern described above, and the plurality of light sources 111 may be provided in various patterns to allow light to be emitted with uniform luminance.

The light source 111 may employ an element configured to emit monochromatic light (light of a specific wavelength, for example, blue light) or white light (for example, light of a mixture of red light, green light, and blue light) in various directions by receiving power. For example, the light source 111 may include a light emitting diode (LED).

The substrate 112 may fix the plurality of light sources 111 to prevent a change in the position of the light source 111. That is, the plurality of light sources 111 are fixedly arranged on the substrate 112 so that the light source 111 do not move. Further, the substrate 112 may supply power for the light source 111 to emit light.

The substrate 112 may fix the plurality of light sources 111 and may be configured with synthetic resin or tempered glass or a printed circuit board (PCB) on which a conductive power supply line for supplying power to the light source 111 is formed.

The reflective sheet 120 may reflect light emitted from the plurality of light sources 111 forward or in a direction close to the front.

In the reflective sheet 120, a plurality of through holes 120a is formed at positions corresponding to each of the plurality of light sources 111 of the light source module 110. In addition, the light source 111 of the light source module 110 may pass through the through hole 120a and protrude to the front of the reflective sheet 120. The light source 111 may be provided in the through hole 120a.

For example, as shown in the upper portion of FIG. 5, in the process of assembling the reflective sheet 120 and the light source module 110, the plurality of light sources 111 of the light source module 110 is inserted into the through holes 120a formed on the reflective sheet 120. Accordingly, as shown in the lower portion of FIG. 5, the substrate 112 of the light source module 110 may be provided behind the reflective sheet 120, but the plurality of light sources 111 of the light source module 110 may be provided in front of the reflective sheet 120.

Accordingly, the plurality of light sources 111 may emit light in front of the reflective sheet 120.

The plurality of light sources 111 may emit light in various directions in front of the reflective sheet 120. The light may be emitted not only toward the diffuser plate 130 from the light source 111, but also toward the reflective sheet 120 from the light source 111. The reflective sheet 120 may reflect light, which is emitted toward the reflective sheet 120, toward the diffuser plate 130.

Light emitted from the light source 111 passes through various objects, such as the diffuser plate 130 and the optical sheet 140. Among incident light beams passing through the diffuser plate 130 and the optical sheet 140, some of the incident light beams are reflected from the surfaces of the diffuser plate 130 and the optical sheet 140. The reflective sheet 120 may reflect light reflected by the diffuser plate 130 and the optical sheet 140.

The diffuser plate 130 may be provided in front of the light source module 110 and the reflective sheet 120, and may evenly distribute the light emitted from the light source 111 of the light source module 110.

As described above, the plurality of light sources 111 is provided in various places on the rear surface of the light source apparatus 100. Although the plurality of light sources 111 is provided at equal intervals on the rear surface of the light source apparatus 100, unevenness in luminance may occur depending on the positions of the plurality of light sources 111.

Within the diffuser plate 130, the diffuser plate 130 may diffuse light emitted from the plurality of light sources 111 to remove unevenness in luminance caused by the plurality of light sources 111. In other words, the diffuser plate 130 may uniformly emit uneven light of the plurality of light sources 111 to the front surface.

The optical sheet 140 may include various sheets for improving luminance and luminance uniformity. For example, the optical sheet 140 may include a diffusion sheet 141, a first prism sheet 142, a second prism sheet 143, and a reflective polarizing sheet 144.

The diffusion sheet 141 diffuses light for the luminance uniformity. The light emitted from the light source 111 may be diffused by the diffuser plate 130 and may be diffused again by the diffusion sheet 141 included in the optical sheet 140.

The first and second prism sheets 142 and 143 may increase the luminance by condensing light diffused by the diffusion sheet 141. The first and second prism sheets 142 and 143 include a prism pattern in the shape of a triangular prism, and the prism pattern, which is provided in plurality, is provided adjacent to each other to form a plurality of strips.

The reflective polarizing sheet 144 is a type of polarizing film and may transmit some of the incident light beams and reflect others for improving the luminance. For example, the reflective polarizing sheet 144 may transmit polarized light in the same direction as a predetermined polarization direction of the reflective polarizing sheet 144, and may reflect polarized light in a direction different from the polarization direction of the reflective polarizing sheet 144. In addition, the light reflected by the reflective polarizing sheet 144 is recycled inside the light source apparatus 100, and thus the luminance of the display apparatus 10 may be improved by the light recycling.

The optical sheet 140 is not limited to the sheet or film shown in FIG. 4, and may include various other sheets according to other example embodiments, such as a protective sheet, or films.

Figure 6:
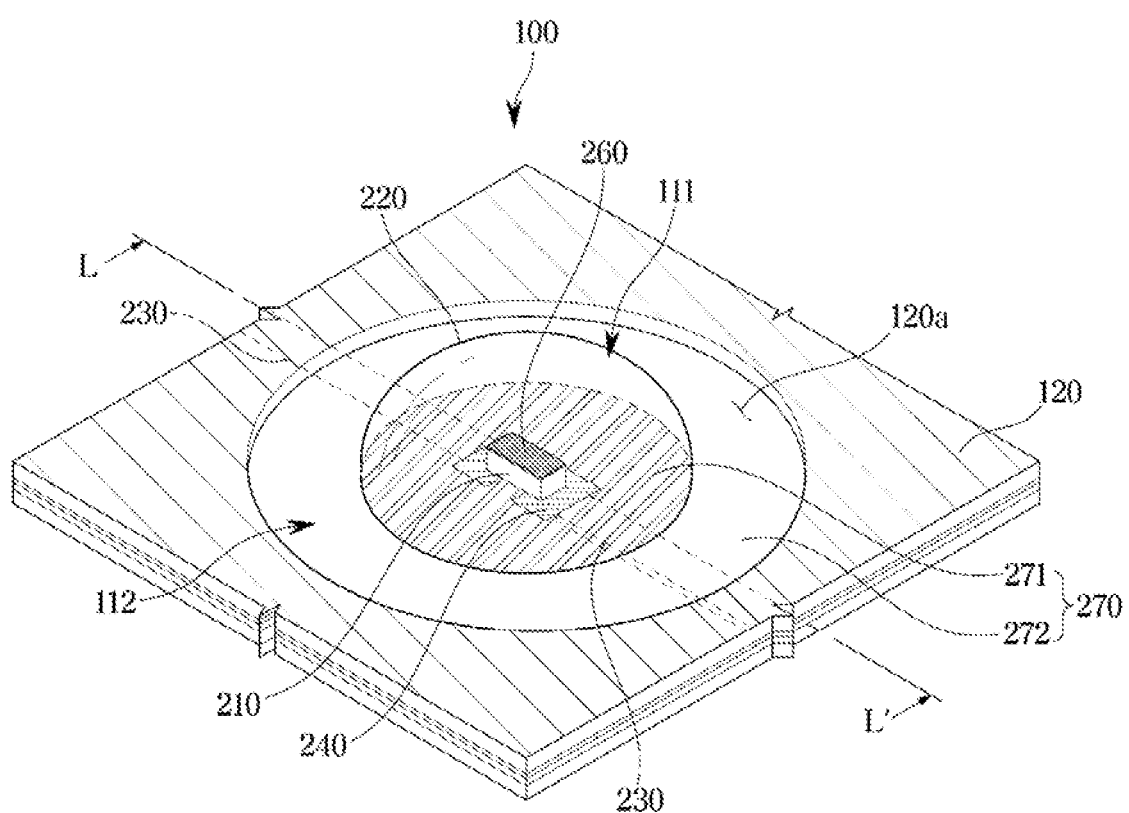
FIG. 6 is a perspective view of a light source included in the light source apparatus shown in FIG. 4.
Figure 7:
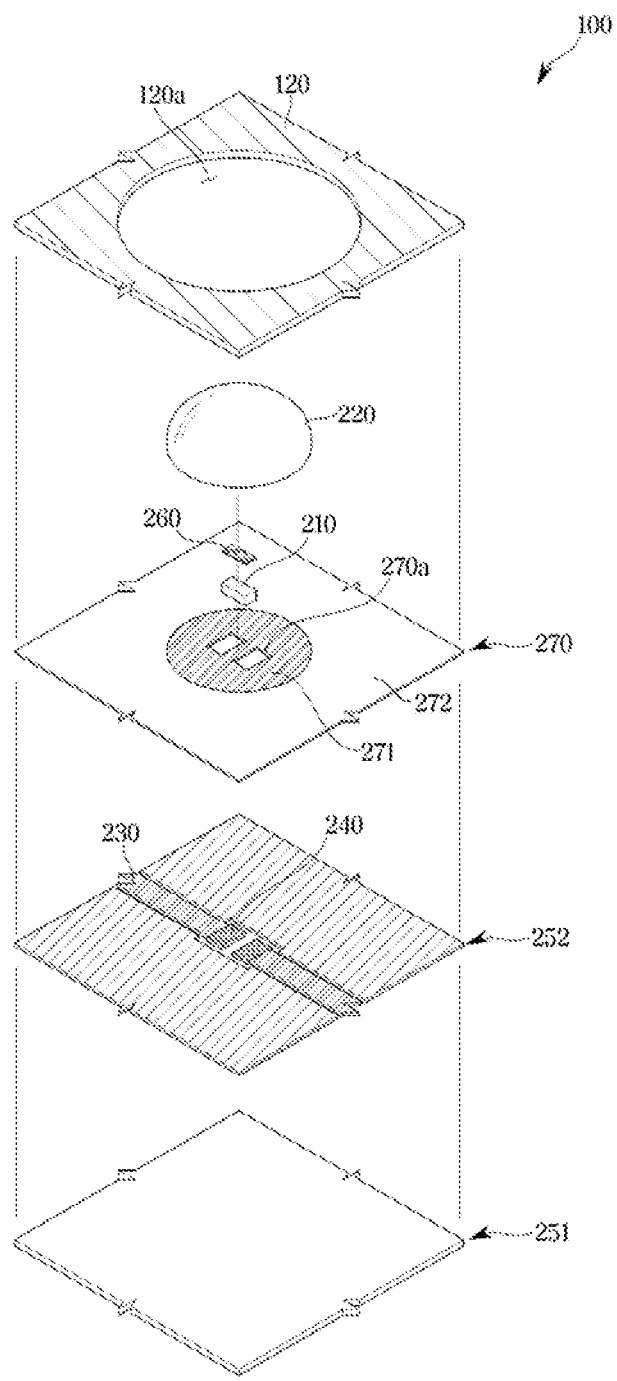
FIG. 7 is an exploded view of the light source shown in FIG. 6.
Figure 8:
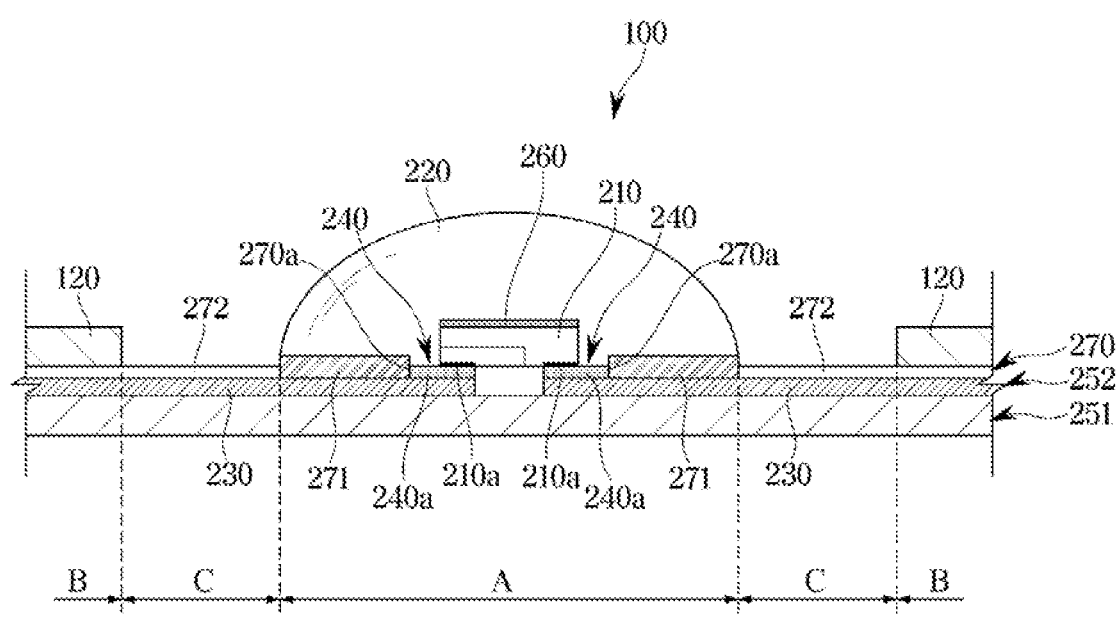
FIG. 8 is a cross-sectional view taken along line L-L' shown in FIG. 6.

FIG. 6 is a perspective view of a light source included in the light source apparatus shown in FIG. 4. FIG. 7 is an exploded view of the light source shown in FIG. 6. FIG. 8 is a cross-sectional view taken along line L-L' shown in FIG. 6.

The light source 111 of the light source apparatus 100 will be described with reference to FIGS. 6 to 8.

As described above, the light source module 110 includes the plurality of light sources 111. The plurality of light sources 111 may protrude forward of the reflective sheet 120 from the rear of the reflective sheet 120 by passing through the through hole 120a. Accordingly, as shown in FIGS. 6 and 7, the light source 111 and a part of the substrate 112 may be exposed toward the front of the reflective sheet 120 through the through hole 120a.

The light source 111 may include an electrical/mechanical structure provided in a region defined by the through hole 120a of the reflective sheet 120.

Each of the plurality of light sources 111 may include a light emitting diode 210, an optical dome 220, and a reflective layer 260.

The light emitting diode 210 may include a P-type semiconductor and an N-type semiconductor for emitting light by recombination of holes and electrons. In addition, the light emitting diode 210 is provided with a pair of electrodes 210a for supplying hole and electrons to the P-type semiconductor and the N-type semiconductor, respectively.

The light emitting diode 210 may convert electrical energy into optical energy. In other words, the light emitting diode 210 may emit light having a maximum intensity at a predetermined wavelength to which power is supplied. For example, the light emitting diode 210 may emit blue light having a peak value at a wavelength indicating blue (for example, a wavelength between 430 nm and 495 nm).

The light emitting diode 210 may be directly attached to the substrate 112 in a Chip On Board (COB) method. In other words, the light source 111 may include the light emitting diode 210 to which a light emitting diode chip or a light emitting diode die is directly attached to the substrate 112 without an additional packaging.

In order to reduce the size of the light source 111, the light source module 110, in which the flip-chip type light emitting diode 210 is attached to the substrate 112 in a chip-on-board method, may be manufactured.

On the substrate 112, a power supply line 230 and a power supply pad 240 for supplying power to the flip-chip type light emitting diode 210 is provided.

On the substrate 112, the power supply line 230 for supplying electrical signals and/or power to the light emitting diode 210 from the control assembly 50 and/or the power assembly 60 is provided.

As shown in FIG. 8, the substrate 112 may be formed by alternately laminating an insulation layer 251 that is non-conductive and a conduction layer 252 that is conductive. The conduction layer 252 may be provided between the insulation layer 251 and a protection layer 270.

A line or pattern, through which power and/or electrical signals pass, is formed on the conduction layer 252. The conduction layer 252 may be formed of various materials having an electrical conductivity. For example, the conduction layer 252 may be formed of various metal materials, such as copper (Cu), tin (Sn), aluminum (Al), or an alloy thereof.

A dielectric of the insulation layer 251 may insulate between lines or patterns of the conduction layer 252. The insulation layer 251 may be formed of a dielectric for electrical insulation, such as FR-4.

The power supply line 230 may be provided by a line or pattern formed on the conduction layer 252.

The power supply line 230 may be electrically connected to the light emitting diode 210 through the power supply pad 240.

The power supply pad 240 may be formed in such a way that the power supply line 230 is exposed to the outside.

The protection layer 270 configured to prevent or suppress damages caused by an external impact and/or damages caused by a chemical action (for example, corrosion, etc.) and/or damages caused by an optical action, to the substrate 112 may be formed in the substrate 112. The protection layer 270 may be provided on one side facing the reflection sheet 120. The protection layer 270 may include a photo solder resist (PSR).

As shown in FIG. 8, the protection layer 270 may cover the power supply line 230 to prevent the power supply line 230 from being exposed to the outside.

For electrical contact between the power supply line 230 and the light emitting diode 210, a window 270a may be formed in the protection layer 270 to expose a portion of the power supply line 230 to the outside. A portion of the power supply line 230 exposed to the outside through the window 270a of the protection layer 270 may form the power supply pad 240.

A conductive adhesive material 240a for the electrical contact between the power supply line 230 exposed to the outside and the electrode 210a of the light emitting diode 210 is applied to the power supply pad 240. The conductive adhesive material 240a may be applied within the window 270a of the protection layer 270. The window 270a may be formed to allow the power supply pad 240 to be electrically connected to the light emitting diode 210. The window 270a may be formed on a first protection layer 271.

The electrode 210a of the light emitting diode 210 may be in contact with the conductive adhesive material 240a, and the light emitting diode 210 may be electrically connected to the power supply line 230 through the conductive adhesive material 240a.

The conductive adhesive material 240a may include a solder having an electrical conductivity. However, the disclosure is not limited thereto, and the conductive adhesive material 240a may include electrically conductive epoxy adhesives.

Power may be supplied to the light emitting diode 210 through the power supply line 230 and the power supply pad 240, and in response to the supply of the power, the light emitting diode 210 may emit light. A pair of power supply pads 240 corresponding to each of the pair of electrodes 210a provided in the flip chip type light emitting diode 210 may be provided.

The optical dome 220 may cover the light emitting diode 210. The optical dome 220 may prevent or suppress damages to the light emitting diode 210 caused by an external mechanical action and/or damage to the light emitting diode 210 caused by a chemical action.

The optical dome 220 may have a dome shape formed in such a way that a sphere is cut into a surface not including the center thereof, or may have a hemispherical shape in such a way that a sphere is cut into a surface including the center thereof. A vertical cross section of the optical dome 220 may be a bow shape or a semicircle shape.

The optical dome 220 may be formed of silicone or epoxy resin. For example, the molten silicon or epoxy resin may be discharged onto the light emitting diode 210 through a nozzle, and the discharged silicon or epoxy resin may be cured, thereby forming the optical dome 220.

Accordingly, the shape of the optical dome 220 may vary depending on the viscosity of the liquid silicone or epoxy resin. For example, in a state in which the optical dome 220 is manufactured using silicon having a thixotropic index of about 2.7 to 3.3 (appropriately, 3.0), the optical dome 220 may include a dome ratio (a height of the dome/a diameter of a base) of approximately 0.25 to 0.31 (appropriately 0.28), and the dome ratio may indicate a ratio of a height of a dome to a diameter of a base of the dome. For example, the optical dome 220 formed of silicon having a thixotropic index of approximately 2.7 to 3.3 (appropriately, 3.0) may have a diameter of approximately 2.5 mm and a height of approximately 0.7 mm.

The optical dome 220 may be optically transparent or translucent. Light emitted from the light emitting diode 210 may be emitted to the outside by passing through the optical dome 220.

In this case, the dome-shaped optical dome 220 may refract light like a lens. For example, light emitted from the light emitting diode 210 may be refracted by the optical dome 220 and thus may be dispersed.

As mentioned above, the optical dome 220 may disperse light emitted from the light emitting diode 210 as well as protecting the light emitting diode 210 from external mechanical and/or chemical or electrical actions.

The reflective layer 260 may be provided in front of the light emitting diode 210. The reflective layer 260 may be provided on the front surface of the light emitting diode 210. The reflective layer 260 may be a multilayer reflective structure in which a plurality of insulation layers having different refractive indices is alternately laminated. For example, the multilayer reflective structure may be a Distributed Bragg Reflector (DBR) in which a first insulation layer having a first refractive index and a second insulation layer having a second refractive index are alternately laminated.

The protection layer 270 may include the first protection layer 271 provided adjacent to the light emitting diode 210 and a second protection layer 272 having less reflectance than the first protection layer 271. According to an example embodiment, the second protection layer 272 is provided further away from the light emitting diode 210 than the first protection layer 271. According to an example embodiment, the second protection layer 272 may be provided adjacent to the first protection layer 271 on a side opposite the light emitting diode 210. The first protection layer 271 may include a high reflective photo solder resist (PSR). The second protection layer 272 may include a low reflective PSR. The first protection layer 271 may include a thermosetting infrared ray (IR) ink. The second protection layer 272 may include an epoxy-based insulating ink.

The first protection layer 271 may be provided to correspond to a size of the optical dome 220. The first protection layer 271 may be provided to have a lower reflectance than the reflective sheet 120. The substrate 112 may have a copper color and may have a relatively low reflectance.

The light source apparatus 100 may include a first region A adjacent to the light emitting diode 210, a second region B in which the reflective sheet 120 is provided, and a third region C provided between the first region A and the second region B. For example, the third region C is a region provided between the first region A and the second region B, and includes a portion in which the through hole 120a is formed. A first average reflectance of the first region A, a second average reflectance of the second region B, and a third average reflectance of the third region C may satisfy the following relationship. The average reflectance is defined as a value obtained by dividing a surface reflectance by an area, and is hereinafter referred to as a reflectance for convenience of description.

For example, the reflectance of the first region A may be provided in a range of 90% to 93%, the reflectance of the second region B may be provided in a range of 95% to 97%, and the reflectance of the third region C may be provided in a range of 82% to 86%. By providing a relatively low reflectance of the third region C, a hot spot of light that may occur in the first region A may be supplemented.

Based on the protection layer 270 including a single PSR, particularly, based on the protection layer 270 including a single low reflective PSR, the light source apparatus 100 may have the luminance uniformity as a whole, but a light efficiency thereof may be reduced.

Because the protection layer 270 includes the first protection layer 271 including the high reflective PSR and the second protection layer 272 including the low reflective PSR, the light source apparatus 100 may increase the light efficiency while maintaining the luminance uniformity as a whole.

Particularly, the first region A and the third region C of the light source apparatus 100 correspond to a region adjacent to the light emitting diode 210. However, the second region B corresponds to a region far from the light emitting diode 210, and thus an intensity of light supplied to the second region B may be relatively low as light emitted from the light source 111 is reflected by the diffusion plate 130 and/or the optical sheet 140. Therefore, in order to maintain the luminance uniformity of the light source apparatus 100, it is required to allow the second region B to reflect greater amount of light than the first region A and the third region C. However, in response to the reduction in the light reflected by the first region A and the third region C, the light efficiency of the light source apparatus 100 may be reduced.

Accordingly, in order to increase the light efficiency of the light source apparatus 100, the first protection layer 271 including the high reflective PSR may be provided in the first region A. However, in order to maintain the luminance uniformity of the light source apparatus 100, the first reflectance of the first region A may not exceed the second reflectance of the second region B. Based on the first reflectance of the first region A being greater than the third reflectance of the third region C, the light source apparatus 100 may maintain the luminance uniformity and improve the light efficiency. According to an example, the relationship of the first reflectance, the second reflectance and the third reflectance may be as follows:

third reflectance<first reflectance<second reflectance.

An average value of the reflectance of the first region A and the third region C may be less than the reflectance of the second region B.

Figure 9:
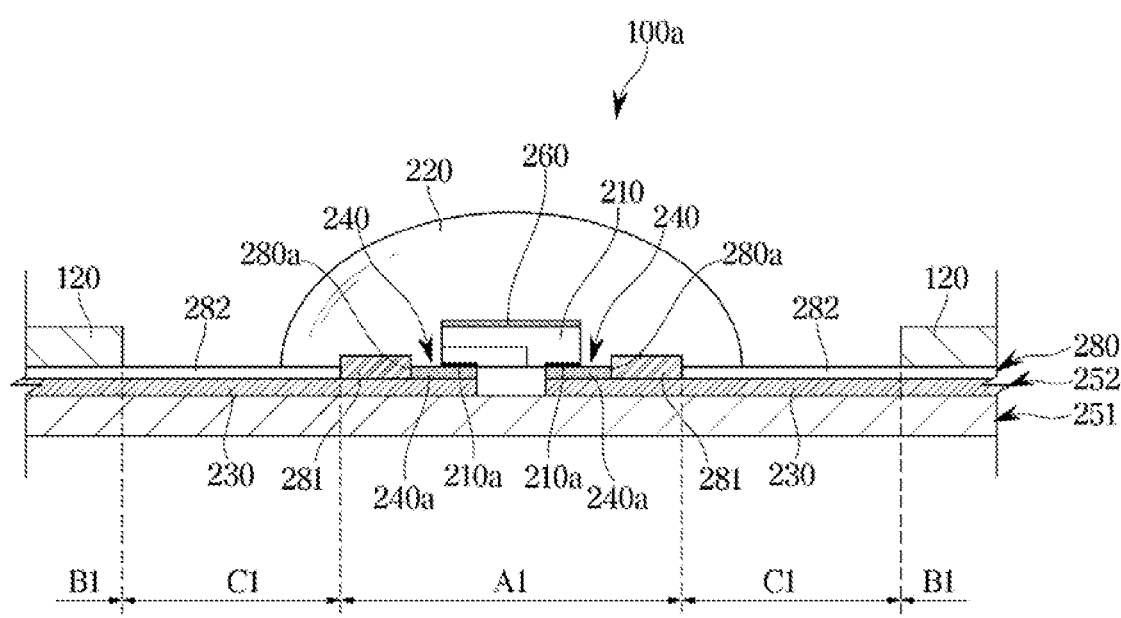
FIG. 9 is a cross-sectional view of a light source apparatus according to another example embodiment of the disclosure.

FIG. 9 is a cross-sectional view of a light source apparatus according to another example embodiment of the disclosure.

A light source apparatus 100a according to another example embodiment of the disclosure will be described with reference to FIG. 9. However, the same reference numerals designate the same components as those of the light source apparatus 100 illustrated in FIG. 8, and detailed descriptions thereof may be omitted.

Referring to FIG. 9, the light source apparatus 100a according to another example embodiment of the disclosure may include a protection layer 280.

The protection layer 280 may include a first protection layer 281 disposed adjacent to the light emitting diode 210 and a second protection layer 282 having a less reflectance than the first protection layer 281. The first protection layer 281 may include a high reflective PSR. The second protection layer 282 may include a low reflective PSR. A window 280a may be formed on the first protection layer 281. The first protection layer 281 may have a less reflectance than the reflective sheet 120. The first protection layer 281 may include a thermosetting IR ink. The second protection layer 282 may include an epoxy-based insulating ink.

The light source apparatus 100a may include a first region A1 adjacent to the light emitting diode 210, a second region B1 in which the reflective sheet 120 is disposed, and a third region C1 in which the first region A1 is excluded from a portion in which the through hole 120a is formed. A first average reflectance of the first region A1, a second average reflectance of the second region B1, and a third average reflectance of the third region C1 may satisfy the following relationship. The average reflectance is defined as a value obtained by dividing a surface reflectance by an area, and is hereinafter referred to as a reflectance for convenience of description.

For example, the reflectance of the first region A1 may be provided in a range of 90% to 93%, the reflectance of the second region B1 may be provided in a range of 95% to 97%, and the reflectance of the third region C1 may be provided in a range of 82% to 86%. By providing a relatively low reflectance of the third region C1, a hot spot of light that may occur in the first region A1 may be supplemented.

Unlike the light source apparatus 100 shown in FIG. 8, as for the light source apparatus 100a shown in FIG. 9, the first protection layer 281 may be provided to be smaller than the optical dome 220. Based on the first protection layer 281 being smaller than the optical dome 220, the light source apparatus 100a may improve the luminance uniformity in comparison with the light source apparatus 100 shown in FIG. 8.

An average value of the reflectance of the first region A1 and the third region C1 may be less than the reflectance of the second region B1.

Figure 10:
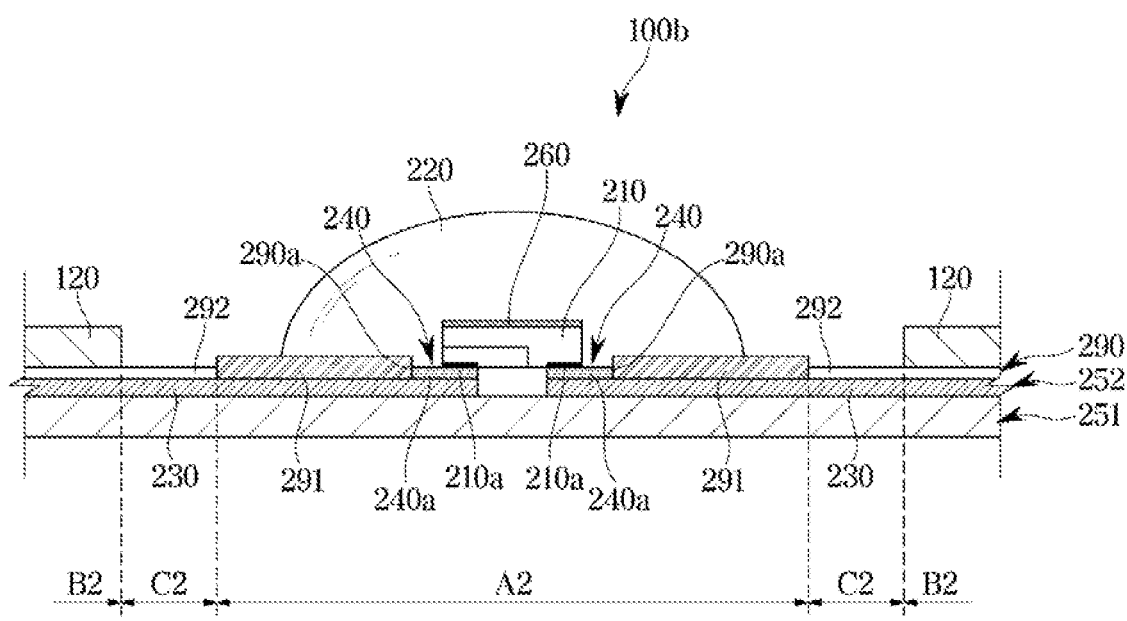
FIG. 10 is a cross-sectional view of a light source apparatus according to still another example embodiment of the disclosure.

FIG. 10 is a cross-sectional view of a light source apparatus according to still another example embodiment of the disclosure.

A light source apparatus 100b according to still another example embodiment of the disclosure will be described with reference to FIG. 10. However, the same reference numerals designate the same components as those of the light source apparatus 100 illustrated in FIG. 8, and detailed descriptions thereof may be omitted.

Referring to FIG. 10, the light source apparatus 100b according to still another example embodiment of the disclosure may include a protection layer 290.

The protection layer 290 may include a first protection layer 291 disposed adjacent to the light emitting diode 210 and a second protection layer 292 having a less reflectance than the first protection layer 291. The first protection layer 291 may include a high reflective PSR. The second protection layer 292 may include a low reflective PSR. A window 290a may be formed on the first protection layer 291. The first protection layer 291 may have a less reflectance than the reflective sheet 120. The first protection layer 291 may include a thermosetting IR ink. The second protection layer 292 may include an epoxy-based insulating ink.

The light source apparatus 100b may include a first region A2 adjacent to the light emitting diode 210, a second region B2 in which the reflective sheet 120 is disposed, and a third region C2 in which the first region A2 is excluded from a portion in which the through hole 120a is formed. A first average reflectance of the first region A2, a second average reflectance of the second region B2, and a third average reflectance of the third region C2 may satisfy the following relationship. The average reflectance is defined as a value obtained by dividing a surface reflectance by an area, and is hereinafter referred to as a reflectance for convenience of description.

For example, the reflectance of the first region A2 may be provided in a range of 90% to 93%, the reflectance of the second region B2 may be provided in a range of 95% to 97%, and the reflectance of the third region C2 may be provided in a range of 82% to 86%. By providing a relatively low reflectance of the third region C2, a hot spot of light that may occur in the first region A2 may be supplemented.

Unlike the light source apparatus 100 shown in FIG. 8, as for the light source apparatus 100b shown in FIG. 10, the first protection layer 291 may be provided to be larger than the optical dome 220. Based on the first protection layer 291 being larger than the optical dome 220, the light source apparatus 100b shown in FIG. 10 may improve the light efficiency in comparison with the light source apparatus 100 shown in FIG. 8.

An average value of the reflectance of the first region A2 and the third region C2 may be less than the reflectance of the second region B2.

As is apparent from the above description, a display apparatus and a light source apparatus thereof may improve a light efficiency while maintaining a luminance uniformity, by including a high reflective member disposed on a portion of a vicinity of a light emitting diode.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A light source apparatus comprising:
a reflective sheet having a through hole;
a light source provided in the through hole and comprising a light emitting diode; and
a substrate to which the light emitting diode is attached and comprising a protection layer provided on a first side of the substrate facing the reflective sheet,
wherein the protection layer comprises:
a first protection layer provided adjacent to the light emitting diode, the first protection layer having a lower reflectance than the reflective sheet; and
a second protection layer having a lower reflectance than the first protection layer.

2. The light source apparatus of claim 1, further comprising:
a first region adjacent to the light emitting diode;
a second region in which the reflective sheet is provided; and
a third region between the first region and the second region,
wherein a first reflectance of the first region, a second reflectance of the second region, and a third reflectance of the third region satisfy the following relationship:
third reflectance<first reflectance<second reflectance.

3. The light source apparatus of claim 1, wherein
the light source comprises an optical dome provided to cover the light emitting diode and provided to be spaced apart from the reflective sheet.

4. The light source apparatus of claim 3, wherein
a size of the first protection layer corresponds to a size of the optical dome.

5. The light source apparatus of claim 3, wherein
a size of the first protection layer is greater than a size of the optical dome.

6. The light source apparatus of claim 3, wherein
a size of the first protection layer is less than a size of the optical dome.

7. The light source apparatus of claim 1, wherein
the light source comprises a reflective layer provided in front of the light emitting diode, the reflective layer comprising a multilayer reflective structure.

8. The light source apparatus of claim 1, wherein
the substrate comprises:
an insulation layer;
a conduction layer provided between the insulation layer and the protection layer; and
a power supply line and a power supply pad provided on the conduction layer to supply power to the light emitting diode.

9. The light source apparatus of claim 8, wherein
the protection layer comprises a window configured to allow the power supply pad to be electrically connected to the light emitting diode.

10. A display apparatus comprising:
a body; and
a light source apparatus provided in the body,
wherein the light source apparatus comprises:
a reflective sheet having a through hole;
a light source provided in the through hole and comprising a light emitting diode; and
a substrate provided to support the light source,
wherein a first reflectance of a first region adjacent to the light emitting diode, a second reflectance of a second region, in which the reflective sheet is provided, and a third reflectance of a third region between the first region and the second region satisfy the following relationship:
third reflectance<first reflectance<second reflectance.

11. The display apparatus of claim 10, wherein
the light source comprises an optical dome configured to cover the light emitting diode and provided to be spaced apart from the reflective sheet.

12. The display apparatus of claim 11, wherein
a size of the first region corresponds to a size of the optical dome.

13. The display apparatus of claim 11, wherein
a size of the first region is greater than a size of the optical dome.

14. The display apparatus of claim 11, wherein
a size of the first region is less than a size of the optical dome.

15. A light source apparatus comprising:
a substrate;
a reflective sheet provided on the substrate and having a plurality of through holes;
a plurality of light emitting diode provided on substrate,
wherein each of the plurality of light emitting diode is provided in a respective one of the through holes of the reflective sheet,
wherein a first reflectance of a first region adjacent to the light emitting diode is less than a second reflectance of a second region in which the reflective sheet is provided, and
wherein a third reflectance of a third region between the first region and the second region is less than the first reflectance.

* * * * *